(12) United States Patent
Feng et al.

(10) Patent No.: US 10,788,582 B2
(45) Date of Patent: Sep. 29, 2020

(54) OPTICAL SENSOR CHIP

(71) Applicant: SiLC Technologies, Inc., Monrovia, CA (US)

(72) Inventors: Dazeng Feng, El Monte, CA (US); Bradley Jonathan Luff, La Canada Flintridge, CA (US); Mehdi Asghari, La Canada Flintridge, CA (US)

(73) Assignee: SiLC Technologies, Inc., Monrovia, CA (US)

( * ) Notice: Subject to any disclaimer, the term of this patent is extended or adjusted under 35 U.S.C. 154(b) by 0 days.

(21) Appl. No.: 15/977,957

(22) Filed: May 11, 2018

(65) Prior Publication Data
US 2019/0346568 A1    Nov. 14, 2019

(51) Int. Cl.
*G01C 3/08* (2006.01)
*G01S 17/08* (2006.01)
*G02B 6/122* (2006.01)
*H01L 25/16* (2006.01)
*G01S 17/89* (2020.01)
*G02B 6/12* (2006.01)

(52) U.S. Cl.
CPC .............. *G01S 17/08* (2013.01); *G01S 17/89* (2013.01); *G02B 6/122* (2013.01); *H01L 25/167* (2013.01); *G02B 2006/12097* (2013.01)

(58) Field of Classification Search
CPC ....... G01S 17/08; G01S 17/89; H01L 25/167; G02B 6/122; G02B 2006/12097
See application file for complete search history.

(56) References Cited

U.S. PATENT DOCUMENTS 8,410,566 B2 † 4/2013 Qian
9,157,790 B2   10/2015 Shpunt et al.
10,222,474 B1 * 3/2019 Raring ................ H01S 5/02212
(Continued)

FOREIGN PATENT DOCUMENTS

EP    2796890 A1    10/2014
WO    2018060318 A1 †  4/2018

OTHER PUBLICATIONS

Baghmisheh, B. B., "Chip-scale Lidar", 2017, University of California, Berkeley.

(Continued)

*Primary Examiner* — Samantha K Abraham
(74) *Attorney, Agent, or Firm* — Gavrilovich, Dodd & Lindsey LLP

(57) ABSTRACT

The LIDAR chip includes a utility waveguide that guides an outgoing LIDAR signal to a facet through which the outgoing LIDAR signal exits from the chip. The chip also includes a control branch that removes a portion of the outgoing LIDAR signal from the utility waveguide. The control branch includes a control light sensor that receives a light signal that includes light from the removed portion of the outgoing LIDAR signal. The chip also includes a data branch that removes a second portion of the outgoing LIDAR signal from the utility waveguide. The data branch includes a light-combining component that combines a reference light signal that includes light from the second portion of the outgoing LIDAR signal with a comparative light signal that includes light that was reflected off an object located off of the chip.

20 Claims, 3 Drawing Sheets

(56) References Cited

U.S. PATENT DOCUMENTS

| | | | |
|---|---|---|---|
| 2002/0031304 A1* | 3/2002 | Roberts | G02B 6/12004 385/43 |
| 2007/0036486 A1 | 2/2007 | Miyadera et al. | |
| 2011/0095167 A1 | 4/2011 | Feng et al. | |
| 2013/0083389 A1 | 4/2013 | Dakin et al. | |
| 2015/0185244 A1* | 7/2015 | Inoue | G01P 3/68 356/5.09 |
| 2019/0101647 A1* | 4/2019 | Feshali | G01S 17/42 |

OTHER PUBLICATIONS

Doylend, J. K., "Two-dimensional free-space beam steering with an optical phased array on silicon-on-insulator", 2011, Optics Express, 19(22), 21595-2160.

Issakov, V. "Radar Systems, Ch. 2. In Microwave Circuits for 24GHz Automotive Radar in Silicon-based Technologies", 2010, Berlin Heidelberg: Springer-Verlag.

Li, L., "Time-of-Flight Camera—An Introduction", 2014, TI Technical White Paper SLOA190B.

Velodyne, "HDL-64E S2 Datasheet. Retrieved from http://velodynelidar.com/lidar/products/brochure/HDL-64E%20S2%20datasheet_2010_lowres.pdf", 2017.

Kang, Sung Chul, International Search Report and Written Opinion, PCT/US2019/031632, Korean Patent Office, dated Sep. 18, 2019.

Christopher V. Poulton et al., "Coherent Solid-State LIDAR with Silicon Photonic Optical Phased Arrays", pp. 4091-4094, Oct. 15, 2017, Optics Letters, vol. 42, No. 20.†

Timo Aalto et al., "VTT's Micron-Scale Silicon Rib+Strip Waveguide Platform", pp. 1-8, May 13, 2016, Conference Proceedings of SPIE Photonics Europe Conference, Proc. SPIE 9891, Silicon Photonics and Photonic Integrated Circuits V, 98911G; doi: 10.1117/12.2234588.†

\* cited by examiner
† cited by third party

OPTICAL SENSOR CHIP

FIELD

The invention relates to optical devices. In particular, the invention relates to LIDAR chips.

BACKGROUND

There is an increasing commercial demand for 3D sensing systems that can be economically deployed in applications such as ADAS (Advanced Driver Assistance Systems) and AR (Augmented Reality). LIDAR (Light Detection and Ranging) sensors are used to construct a 3D image of a target scene by illuminating the scene with laser light and measuring the returned signal.

Frequency Modulated Continuous Wave (FMCW) is an example of a coherent detection method can be used for LIDAR applications. The FMCW technique is capable of determining both distance and velocity of an object with a single measurement. Additionally, FMCW techniques have reduced sensitivity to ambient light and light from other LIDAR systems.

An integrated FMCW LIDAR chip is not yet available. Additionally, efforts to generate chips that have a portion of the LIDAR chip components have been limited in the amount of optical power they can transmit without signal degradation. This signal degradation limits the amount of transmitted laser power to the reflecting object. This limit to the amount of transmitted laser power limits overall sensitivity of the device. For these reasons, there is a need for a platform capable of integrating the LIDAR chip while also providing the optical power needed to achieve the desired sensitivity levels.

SUMMARY

A LIDAR chip includes one or more ridge waveguides having a ridge of a light-transmitting medium extending away from slab regions of the light-transmitting medium. The ridge has a width greater than 1 µm and less than 4 µm and a height greater than 1 µm and less than 4 µm. The slab regions have a thickness greater than 0.0 µm and less than 3 µm. In some instance, the chip is a silicon-on-insulator chip.

Another embodiment of a LIDAR chip includes a utility waveguide that guides an outgoing LIDAR signal to a facet through which the outgoing LIDAR signal exits from the chip. The chip also includes a control branch that removes a portion of the outgoing LIDAR signal from the utility waveguide. The control branch includes a control light sensor that receives a light signal that includes light from the removed portion of the outgoing LIDAR signal. The chip also includes a data branch that removes a second portion of the outgoing LIDAR signal from the utility waveguide. The data branch includes a light-combining component that combines a reference light signal that includes light from the second portion of the outgoing LIDAR signal with a comparative light signal that includes light that was reflected off of an object located off of the chip.

Another embodiment of the chip includes a utility waveguide that terminates at a facet through which an outgoing LIDAR signal exits from the chip. The utility waveguide is also configured to receive a LIDAR input light signal through the facet. The LIDAR input light signal includes light from the outgoing LIDAR signal. The chip also includes a data branch that includes a light sensor configured to receive a light signal that includes light from the LIDAR input light signal.

Another embodiment of the chip includes a utility waveguide that terminates at a facet through which at least a portion of an outgoing LIDAR signal exits from the LIDAR chip. The chip also includes an optical attenuator configured to attenuate an intensity of the outgoing LIDAR signal on the utility waveguide.

Another embodiment of the chip includes a waveguide that receives a comparative light signal that includes light from a LIDAR input light signal. The LIDAR input light signal includes light reflected by an object located off of the chip. The chip also includes an optical attenuator configured to attenuate an intensity of the comparative light signal on the waveguide.

DESCRIPTION

A LIDAR chip is disclosed that integrates full optical LIDAR functionality onto a single optical chip. The chip also provides optical components for monitoring and controlling the optical functionality of the chip. For instance, the chip includes optical components for controlling the frequency and intensity of the outgoing LIDAR signal transmitted from the chip. The chip also includes optical components for controlling the intensity of the LIDAR input light signal received by the chip after being reflected by an off-chip object.

The chip is suitable for construction on a variety of platforms such as the silicon-on-insulator (SOI) platform. The chip can include multiple waveguides; however, the waveguide dimensions are increased above the dimensions of standard silicon photonics LIDAR approaches in order to make these chip constructions suitable for LIDAR applications. A LIDAR chip transmits an output light signal which is reflected by an object located off the chip. A portion of the reflected light signal is received by the LIDAR chip. As a result of this mechanism, the power of the reflected light signal that is actually available to the LIDAR chip for processing can be undesirably low.

The waveguide dimensions that are generally used with LIDAR chips constructed from SOI-type platforms are often a source of optical power and phase loss that makes these chips difficult or even impossible to apply to LIDAR applications. However, the inventors have found that increasing the waveguide dimensions while maintaining a single-mode configuration allows these LIDAR chips to be successfully applied to LIDAR applications. For instance, the chip can include ridge waveguides that each includes a ridge of a light-transmitting medium such as silicon extending from slab regions of the light-transmitting medium. Constructing the ridge waveguides such that the ridge has a width greater than 1 µm and less than 4 µm, a height greater than 1 µm and less than 4 µm and extends away from slab regions with a thickness greater than 0.0 μm and less than 3 μm allows the chip to be successfully used for LIDAR applications.

Figure 1:
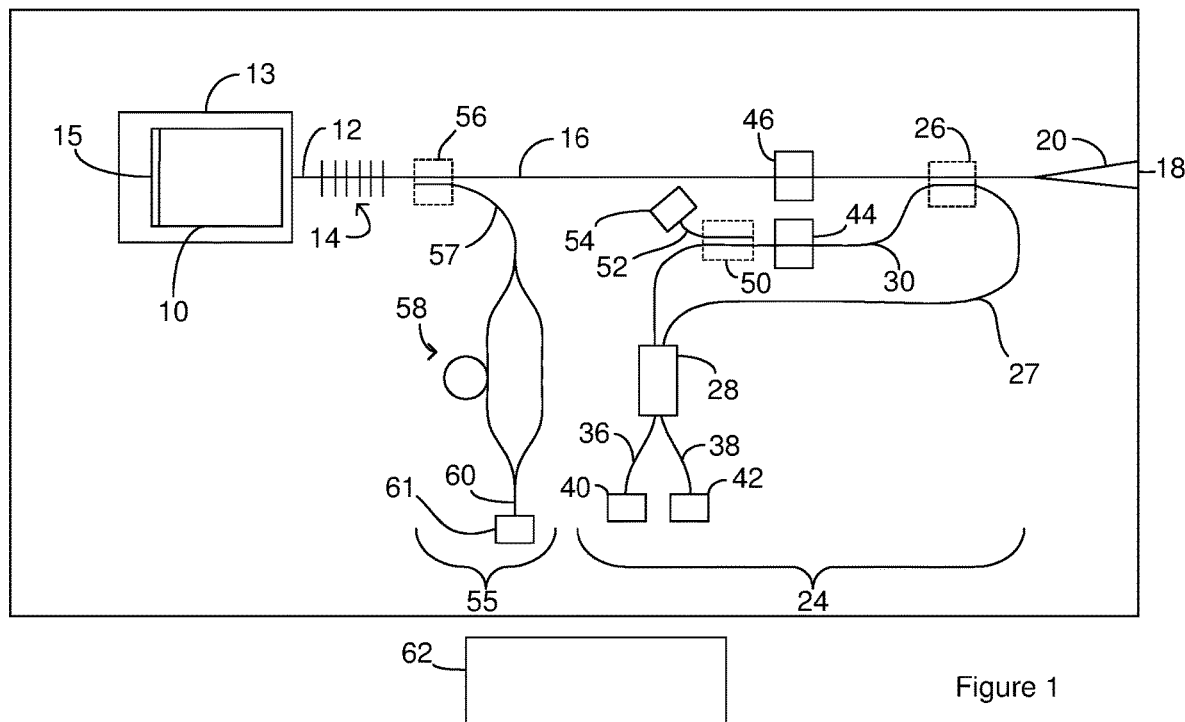
FIG. 1 is a top view of a LIDAR chip.

FIG. 1 is a topview of a LIDAR chip that includes a laser cavity. The laser cavity includes a light source 10 that can include or consist of a gain medium (not shown) for a laser. The chip also includes a cavity waveguide 12 that receives a light signal from the light source 10. The light source can be positioned in a recess 13 so a facet of the light source is optically aligned with a facet of the cavity waveguide 12 to allow the light source and cavity waveguide 12 to exchange light signals. The cavity waveguide 12 carries the light signal to a partial return device 14. The illustrated partial return device 14 is an optical grating such as a Bragg grating. However, other partial return devices 14 can be used; for instance, mirrors can be used in conjunction with echelle gratings and arrayed waveguide gratings.

The partial return device 14 returns a return portion of the light signal to the cavity waveguide 12 as a return signal. For instance, the cavity waveguide 12 returns the return signal to the light source 10 such that the return portion of the light signal travels through the gain medium. The light source 10 is configured such that at least a portion of the return signal is added to the light signal that is received at the cavity waveguide 12. For instance, the light source 10 can include a highly, fully, or partially reflective device 15 that reflects the return signal received from the gain medium back into the gain medium. As a result, light can resonate between the partial return device 14 and the reflective device 15 so as to form a Distributed Bragg Reflector (DBR) laser cavity. A DBR laser cavity has an inherently narrow-linewidth and a longer coherence length than DFB lasers and accordingly improves performance when an object reflecting the LIDAR output signal from the chip is located further away from the chip.

The partial return device 14 passes a portion of the light signal received from the cavity waveguide 12 to a utility waveguide 16 included on the chip. The portion of the light signal that the utility waveguide 16 receives from the partial return device 14 serves as the output of the laser cavity. The output of the laser cavity serves as an outgoing LIDAR signal on the utility waveguide 16. The utility waveguide 16 terminates at a facet 18 and carries the outgoing LIDAR signal to the facet 18. The facet 18 can be positioned such that the outgoing LIDAR signal traveling through the facet 18 exits the chip and serves as a LIDAR output signal. For instance, the facet 18 can be positioned at an edge of the chip so the outgoing LIDAR signal traveling through the facet 18 exits the chip and serves as a LIDAR output signal.

The LIDAR output signal travels away from the chip and is reflected by objects in the path of the LIDAR signal. The reflected signal travels away from the objects. At least a portion of the reflected signal returns to the facet 18 of the utility waveguide 16. Accordingly, a portion of the reflected signal can enter the utility waveguide 16 through the facet 18 and serve as a LIDAR input signal guided by the utility waveguide 16.

The utility waveguide 16 can include a tapered portion before the facet 18. For instance, the utility waveguide 16 can include a taper 20 that terminate at the facet 18. The taper 20 can relax the alignment tolerances required for efficient coupling of the utility waveguide 16 to the LIDAR input light and the outgoing LIDAR signal. Accordingly, the taper 20 can increase the percentage of the LIDAR input signal that is successfully returned to the chip for processing. In some instances, the taper 20 is constructed such that the facet 18 has an area that is more than two, five, or ten times the area of a cross section of a straight portion of the utility waveguide 16. Although FIG. 1 shows the taper 20 as a horizontal taper, the taper 20 can be a horizontal and/or vertical taper. The horizontal and/or vertical taper can be linear and/or curved. In some instances, the taper 20 is an adiabatic taper.

The chip includes a data branch 24 where the optical signals that are processed for LIDAR data are generated. The data branch includes an optical coupler 26 that moves a portion of the light signals from the utility waveguide 16 into the data branch. For instance, an optical coupler 26 couples a portion of the outgoing LIDAR signal from the utility waveguide 16 onto a reference waveguide 27 as a reference signal. The reference waveguide 27 carries the reference signal to a light-combining component 28.

The optical coupler 26 also couples a portion of the LIDAR input signal from the utility waveguide 16 onto a comparative waveguide 30 as a comparative signal. The comparative signal includes at least a portion of the light from the LIDAR input signal. The comparative signal can exclude light from the reference light signal. The comparative waveguide 30 carries the comparative signal to the light-combining component 28.

The illustrated optical coupler 26 is a result of positioning the utility waveguide 16 sufficiently close to the reference waveguide 27 and the comparative waveguide 30 that light from the utility waveguide 16 is coupled into the reference waveguide 27 and the comparative waveguide 30; however, other signal tapping components can be used to move a portion of the of the light signals from the utility waveguide 16 onto the reference waveguide 27 and the comparative waveguide 30. Examples of suitable signal tapping components include, but are not limited to, y-junctions, multi-mode interference couplers (MMIs), and integrated optical circulators.

The light-combining component 28 combines the comparative signal and the reference signal into a composite signal. The reference signal includes light from the outgoing LIDAR signal. For instance, the reference signal can serve as a sample of the outgoing LIDAR signal. The reference signal can exclude light from the LIDAR output signal and the LIDAR input signal. In contrast, the comparative signal light includes light from the LIDAR input signal. For instance, the comparative signal can serve as a sample of the LIDAR input signal. Accordingly, the comparative signal has been reflected by an object located off of the chip while the LIDAR output signal has not been reflected. When the chip and the reflecting object are moving relative to one another, the comparative signal and the reference signal have different frequencies due to the Doppler effect. As a result, beating occurs between the comparative signal and the reference signal.

The light-combining component 28 also splits the resulting composite sample signal onto a first detector waveguide 36 and a second detector waveguide 38. The first detector waveguide 36 carries a first portion of the composite sample signal to a first light sensor 40 that converts the first portion of the composite sample signal to a first electrical signal. The second detector waveguide 38 carries a second portion of the composite sample signal to a second light sensor 42 that converts the second portion of the composite sample signal to a second electrical signal. Examples of suitable light sensors include germanium photodiodes (PDs), and avalanche photodiodes (APDs).

The light combining component 28, the first light sensor 40 and the second light sensor 42, can be connected as a balanced photodetector that outputs an electrical data signal. For instance, the light combining component 28, the first light sensor 40 and the second light sensor 42 can be connected such that the DC components of the signal photocurrents cancel, improving detection sensitivity. Suitable methods for connecting the first light sensor 40 and the second light sensor 42 as balanced photodetectors includes connecting the first light sensor 40 and the second light sensor 42 in series. In one example, the first light sensor 40 and the second light sensor 42 are both avalanche photodiodes connected in series. Balanced photodetection is desirable for detection of small signal fluctuations.

An example of a suitable light-combining component 28 is a Multi-Mode Interference (MIMI) device such as a 2×2 MIMI device. Other suitable light-combining components 28 include, but are not limited to, adiabatic splitters, and directional coupler. In some instances, the functions of the illustrated light-combining component 28 are performed by more than one optical component or a combination of optical components.

A single light sensor can replace the first light sensor 40 and the second light sensor 42 and can output the data signal. When a single light sensor replaces the first light sensor 40 and the second light sensor 42, the light-combining component 28 need not include light-splitting functionality. As a result, the illustrated light light-combining component 28 can be a 2×1 light-combining component rather than the illustrated 2×1 light-combining component. For instance, the illustrated light light-combining component can be a 2×1 MMI device. In these instances, the chip includes a single detector waveguide that carries the composite sample signal to the light sensor.

The data branch includes a data optical attenuator 44 positioned along the comparative waveguide 30 such that the data optical attenuator 44 can be operated so as to attenuate the comparative signal on the comparative waveguide 30. The chip also includes an output optical attenuator 46 positioned along the utility waveguide 16 such that the output optical attenuator 46 can be operated so as to attenuate the outgoing LIDAR signal on the utility waveguide 16. Suitable attenuators for the data optical attenuator 44 and/or the output optical attenuator 46 are configured to attenuate intensity of a light signal. Examples of a suitable attenuator configured to attenuate intensity of a light signal include carrier injection based PIN diodes, electro-absorption modulators, and Mach-Zehnder (MZ) modulators.

The chip also includes a sampling directional coupler 50 that couples a portion of the comparative signal from the comparative waveguide 30 onto a sampling waveguide 52. The coupled portion of the comparative signal serves as a sampling signal. The sampling waveguide 52 carries the sampling signal to a sampling light sensor 54. Although FIG. 1 illustrates a sampling directional coupler 50 moving a portion of the comparative signal onto the sampling waveguide 52, other signal tapping components can be used to move a portion of the comparative signal from the comparative waveguide 30 onto the sampling waveguide 52. Examples of suitable signal tapping components include, but are not limited to, y-junctions, and MMIs.

The chip includes a control branch 55 for controlling operation of the laser cavity. The control branch includes a directional coupler 56 that moves a portion of the outgoing LIDAR signal from the utility waveguide 16 onto a control waveguide 57. The coupled portion of the outgoing LIDAR signal serves as a tapped signal. Although FIG. 1 illustrates a directional coupler 56 moving portion of the outgoing LIDAR signal onto the control waveguide 57, other signal-tapping components can be used to move a portion of the outgoing LIDAR signal from the utility waveguide 16 onto the control waveguide 57. Examples of suitable signal tapping components include, but are not limited to, y-junctions, and MMIs.

The control waveguide 57 carries the tapped signal to an interferometer 58 that splits the tapped signal and then re-combines the different portions of the tapped signal with a phase differential between the portions of the tapped signal. The illustrated interferometer 58 is a Mach-Zehnder interferometer; however, other interferometers can be used.

The interferometer 58 outputs a control light signal on an interferometer waveguide 60. The interferometer waveguide 60 carries the control light signal to a control light sensor 61 that converts the control light signal to an electrical signal that serves as an electrical control signal. The interferometer signal has an intensity that is a function of the frequency of the outgoing LIDAR signal. For instance, a Mach-Zehnder interferometer will output a sinusoidal control light signal with a fringe pattern. Changes to the frequency of the outgoing lidar signal will cause changes to the frequency of the control light signal. Accordingly, the frequency of the electrical control signal output from the control light sensor 61 is a function of the frequency of the outgoing lidar signal. Other detection mechanisms can be used in place of the control light sensor 61. For instance, the control light sensor 61 can be replaced with a balanced photodetector arranged as the light combining component 28, the first light sensor 40 and the second light sensor 42.

Electronics 62 can operate one or more components on the chip. For instance, the electronics 62 can be in electrical communication with and control operation of the light source 10, the data optical attenuator 44, output optical attenuator 46, the first light sensor 40, the second light sensor 42, the sampling light sensor 54, and the control light sensor 61. Although the electronics 62 are shown off the chip, all or a portion of the electronics can be included on the chip. For instance, the chip can include electrical conductors that connect the first light sensor 40 in series with the second light sensor 42.

During operation of the chip, the electronics 62 operate the light source 10 such that the laser cavity outputs the outgoing LIDAR signal. The electronics 62 then operate the chip through a series of cycles where each cycle generates at least a distance data point. During each cycle, the data signal is sampled multiple times. During each of the samples, the electronics tune the frequency of the outgoing LIDAR signal. As will be described in more detail below, the electronics can employ output from the control branch in order to control the frequency of the outgoing LIDAR signal such that the frequency of the outgoing LIDAR signal as a function of time is known to the electronics. In some instance, a cycle includes a first sample and a second sample. During the first sample, the electronics 62 can increase the frequency of the outgoing LIDAR signal and during a second sample the electronics 62 can decrease the frequency of the outgoing LIDAR signal. For instance, the laser cavity can be configured to output an outgoing LIDAR signal (and accordingly a LIDAR output signal) with a wavelength of 1550 nm. During the first sample, the electronics 62 can increase the frequency of the outgoing LIDAR signal (and accordingly a LIDAR output signal) such that the wavelength decreases from 1550 nm to 1459.98 nm followed by decreasing the frequency of the outgoing LIDAR signal such that the wavelength increases from 1459.98 nm to 1550 nm.

When the outgoing LIDAR signal frequency is increased during the first sample, the LIDAR output signal travels away from the chip and then returns to the chip as a LIDAR input signal. A portion of the LIDAR input signal becomes the comparative signal. During the time that the LIDAR output signal and the LIDAR input signal are traveling between the chip and a reflecting object, the frequency of the outgoing LIDAR signal continues to increase. Since a portion of the outgoing LIDAR signal becomes the reference signal, the frequency of the reference signal continues to increase. As a result, the comparative signal enters the light-combining component with a lower frequency than the reference signal concurrently entering the light-combining component. Additionally, the further the reflecting object is located from the chip, the more the frequency of the reference signal increases before the LIDAR input signal returns to the chip. Accordingly, the larger the difference between the frequency of the comparative signal and the frequency of the reference signal, the further the reflecting object is from the chip. As a result, the difference between the frequency of the comparative signal and the frequency of the reference signal is a function of the distance between the chip and the reflecting object.

For the same reasons, when the outgoing LIDAR signal frequency is decreased during the second sample, the comparative signal enters the light-combining component with a higher frequency than the reference signal concurrently entering the light-combining component and the difference between the frequency of the comparative signal and the frequency of the reference signal during the second sample is also function of the distance between the chip and the reflecting object.

In some instances, the difference between the frequency of the comparative signal and the frequency of the reference signal can also be a function of the Doppler effect because relative movement of the chip and reflecting object can also affect the frequency of the comparative signal. For instance, when the chip is moving toward or away from the reflecting object and/or the reflecting object is moving toward or away from the chip, the Doppler effect can affect the frequency of the comparative signal. Since the frequency of the comparative signal is a function of the speed the reflecting object is moving toward or away from the chip and/or the speed the chip is moving toward or away from the reflecting object, the difference between the frequency of the comparative signal and the frequency of the reference signal is also a function of the speed the reflecting object is moving toward or away from the chip and/or the speed the chip is moving toward or away from the reflecting object. Accordingly, the difference between the frequency of the comparative signal and the frequency of the reference signal is a function of the distance between the chip and the reflecting object and is also a function of the Doppler effect.

The composite sample signal and the data signal each effectively compares the comparative signal and the reference signal. For instance, since the light-combining component combines the comparative signal and the reference signal and these signals have different frequencies, there is beating between the comparative signal and reference signal. Accordingly, the composite sample signal and the data signal have a beat frequency related to the frequency difference between the comparative signal and the reference signal and the beat frequency can be used to determine the difference in the frequency of the comparative signal and the reference signal. A higher beat frequency for the composite sample signal and/or the data signal indicates a higher differential between the frequencies of the comparative signal and the reference signal. As a result, the beat frequency of the data signal is a function of the distance between the chip and the reflecting object and is also a function of the Doppler effect.

As noted above, the beat frequency is a function of two unknowns; the distance between the chip and the reflecting object and the relative velocity of the chip and the reflecting object (i.e., the contribution of the Doppler effect). The change in the frequency difference between the comparative signal and the reference signal ($\Delta f$) is given by $\Delta f = 2\Delta v f/c$ where f is the frequency of the LIDAR output signal and accordingly the reference signal, $\Delta v$ is the relative velocity of the chip and the reflecting object and c is the speed of light in air. The use of multiple different samples permits the electronics 62 to resolve the two unknowns. For instance, the beat frequency determined for the first sample is related to the unknown distance and Doppler contribution and the beat frequency determined for the second sample is also related to the unknown distance and Doppler contribution. The availability of the two relationships allows the electronics 62 to resolve the two unknowns. Accordingly, the distance between the chip and the reflecting object can be determined without influence from the Doppler effect. Further, in some instances, the electronics 62 use this distance in combination with the Doppler effect to determine the velocity of the reflecting object toward or away from the chip.

In instances where the relative velocity of target and source is zero or very small, the contribution of the Doppler effect to the beat frequency is essentially zero. In these instances, the Doppler effect does not make a substantial contribution to the beat frequency and the electronics 62 can take only the first sample to determine the distance between the chip and the reflecting object.

During operation, the electronics 62 can adjust the frequency of the outgoing LIDAR signal in response to the electrical control signal output from the control light sensor 61. As noted above, the magnitude of the electrical control signal output from the control light sensor 61 is a function of the frequency of the outgoing LIDAR signal. Accordingly, the electronics 62 can adjust the frequency of the outgoing LIDAR signal in response to the magnitude of the control. For instance, while changing the frequency of the outgoing LIDAR signal during one of the sample, the electronics 62 can have a range of suitable values for the electrical control signal magnitude as a function of time. At multiple different times during a sample, the electronics 62 can compare the electrical control signal magnitude to the range of values associated with the current time in the sample. If the electrical control signal magnitude indicates that the frequency of the outgoing LIDAR signal is outside the associated range of electrical control signal magnitudes, the electronics 62 can operate the light source 10 so as to change the frequency of the outgoing LIDAR signal so it falls within the associated range. If the electrical control signal magnitude indicates that the frequency of the outgoing LIDAR signal is within the associated range of electrical control signal magnitudes, the electronics 62 do not change the frequency of the outgoing LIDAR signal.

During operation, the electronics 62 can adjust the level of attenuation provided by the output optical attenuator 46 in response to the sampling signal from the sampling light sensor 54. For instance, the electronics 62 operate the output optical attenuator 46 so as to increase the level of attenuation in response to the magnitude of the sampling signal being above a first signal threshold and/or decrease the magnitude of the power drop in response to the magnitude of the sampling signal being below a second signal threshold.

In some instance, the electronics 62 adjust the level of attenuation provided by the output optical attenuator 46 to prevent or reduce the effects of back-reflection on the performance of the laser cavity. For instance, the first signal threshold and/or the second signal threshold can optionally be selected to prevent or reduce the effects of back-reflection on the performance of the laser cavity. Back reflection occurs when a portion of the LIDAR input signal returns to the laser cavity as a returned LIDAR signal. In some instances, on the order of 50% of the LIDAR input signal that passes through the facet 18 returns to the laser cavity. The returned LIDAR signal can affect performance of the laser cavity when the power of the returned LIDAR signal entering the partial return device 14 does not decrease below the power of the outgoing LIDAR signal exiting from the partial return device 14 ("power drop") by more than a minimum power drop threshold. In the illustrated chip, the minimum power drop threshold can be around 35 dB (0.03%). Accordingly, the returned lidar signal can affect the performance of the laser cavity when the power of the returned LIDAR signal entering the partial return device 14 is not more than 35 dB below the power of the outgoing LIDAR signal exiting from the partial return device 14.

The electronics 62 can operate the output optical attenuator 46 so as to reduce the effect of low power drops, e.g. when the target object is very close or highly reflective or both. As is evident from FIG. 1, operation of the output optical attenuator 46 so as to increase the level of attenuation reduces the power of the returned LIDAR signal entering the partial return device 14 and also reduces the power of the returned outgoing LIDAR signal at a location away from the partial return device 14. Since the output optical attenuator 46 is located apart from the partial return device 14, the power of the outgoing LIDAR signal exiting from the partial return device 14 is not directly affected by the operation of the output optical attenuator 46. Accordingly, the operation of the output optical attenuator 46 so as to increase the level of attenuation increases the level of the power drop. As a result, the electronics can employ the optical attenuator 46 so as to tune the power drop.

Additionally, the magnitude of the sampling signal is related to the power drop. For instance, the magnitude of the sampling signal is related to the power of the comparative signal as is evident from FIG. 1. Since the comparative signal is a portion of the lidar input signal, the magnitude of the sampling signal is related to the power of the lidar input signal. This result means the magnitude of the sampling signal is also related to the power of the returned LIDAR signal because the returned LIDAR signal is a portion of the lidar input signal. Accordingly, the magnitude of the sampling signal is related to the power drop.

Since the magnitude of the sampling signal is related to the power drop, the electronics 62 can use the magnitude of the sampling signal to operate the output optical attenuator so as to keep the magnitude of the comparative signal power within a target range. For instance, the electronics 62 can operate the output optical attenuator 46 so as to increase the magnitude of the power drop in response to the sampling signal indicating that the magnitude of power drop is at or below a first threshold and/or the electronics 62 can operate the output optical attenuator 46 so as to decrease the magnitude of the power drop in response to the sampling signal indicating that the magnitude of power drop is at or above a second threshold. In some instances, the first threshold is greater than or equal to the minimum power drop threshold. In one example, the electronics 62 operate the output optical attenuator 46 so as to increase the magnitude of the power drop in response to the magnitude of the sampling signal being above a first signal threshold and/or decrease the magnitude of the power drop in response to the magnitude of the sampling signal being below a second signal threshold. The identification of the value(s) for one, two, three, or four variables selected from the group consisting of the first threshold, the second threshold, the first signal threshold, and the second signal threshold can be determined from calibration of the optical chip during set-up of the LIDAR chip system.

Light sensors can become saturated when the power of the composite light signal exceeds a power threshold. When a light sensor becomes saturated, the magnitude of the data signal hits a maximum value that does not increase despite additional increases in the power of the composite light signal above the power threshold. Accordingly, data can be lost when the power of the composite light signal exceeds a power threshold. During operation, the electronics 62 can adjust the level of attenuation provided by the data optical attenuator 44 so the power of the composite light signal is maintained below a power threshold.

As is evident from FIG. 1, the magnitude of the sampling signal is related to the power of the comparative signal. Accordingly, the electronics 62 can operate the data optical attenuator 44 in response to output from the sampling signal. For instance, the electronics 62 can operate the data optical attenuator so as to increase attenuation of the comparative signal when the magnitude of the sampling signal indicates the power of the comparative signal is above an upper comparative signal threshold and/or can operate the data optical attenuator so as to decrease attenuation of the comparative signal when the magnitude of the sampling signal indicates the power of the comparative signal is below a lower comparative signal threshold. For instance, in some instances, the electronics 62 can increase attenuation of the comparative signal when the magnitude of the sampling signal is at or above an upper comparative threshold and/or the electronics 62 decrease attenuation of the comparative signal when the magnitude of the sampling signal is at or below an upper comparative signal threshold.

Figure 2:
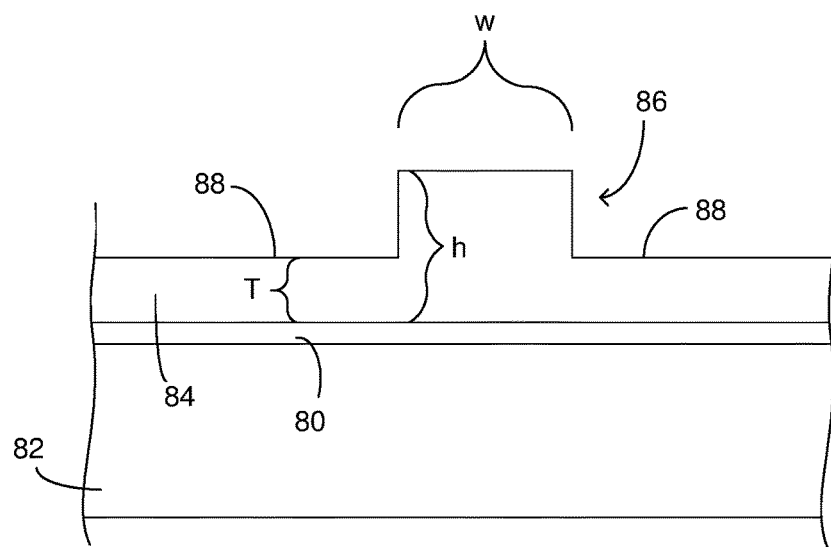
FIG. 2 is a cross-section of a LIDAR chip according to FIG. 1 constructed from a silicon-on-insulator wafer.

As noted above, the electronics 62 can adjust the level of attenuation provided by the output optical attenuator 46 in response to the sampling signal. The electronics 62 can adjust the level of attenuation provided by the data optical attenuator 44 in response to the sampling signal in addition or as an alternative to adjusting the level of attenuation provided by the output optical attenuator 46 in response to the sampling signal Suitable platforms for the chip include, but are not limited to, silica, indium phosphide, and silicon-on-insulator wafers. FIG. 2 is a cross-section of portion of a chip constructed from a silicon-on-insulator wafer. A silicon-on-insulator (SOI) wafer includes a buried layer 80 between a substrate 82 and a light-transmitting medium 84. In a silicon-on-insulator wafer, the buried layer is silica while the substrate and the light-transmitting medium are silicon. The substrate of an optical platform such as an SOI wafer can serve as the base for the entire chip. For instance, the optical components shown in FIG. 1 can be positioned on or over the top and/or lateral sides of the substrate.

The portion of the chip illustrated in FIG. 2 includes a waveguide construction that is suitable for use with chips constructed from silicon-on-insulator wafers. A ridge 86 of the light-transmitting medium extends away from slab regions 88 of the light-transmitting medium. The light signals are constrained between the top of the ridge and the buried oxide layer.

The dimensions of the ridge waveguide are labeled in FIG. 2. For instance, the ridge has a width labeled w and a height labeled h. A thickness of the slab regions is labeled T.

For LIDAR applications, these dimensions are more important than other applications because of the need to use higher levels of optical power than are used in other applications. The ridge width (labeled w) is greater than 1 μm and less than 4 μm, the ridge height (labeled h) is greater than 1 μm and less than 4 μm, the slab region thickness is greater than 0.5 μm and less than 3 μm. These dimensions can apply to straight or substantially straight portions of the waveguide, curved portions of the waveguide and tapered portions of the waveguide(s). Accordingly, these portions of the waveguide will be single mode. However, in some instances, these dimensions apply to straight or substantially straight portions of a waveguide while curved portions of the waveguide and/or tapered portions of the waveguide have dimensions outside of these ranges. For instance, the tapered portions of the utility waveguide 16 illustrated in FIG. 1 can have a width and/or height that is >4 μm and can be in a range of 4 μm to 12 μm. Additionally or alternately, curved portions of a waveguide can have a reduced slab thickness in order to reduce optical loss in the curved portions of the waveguide. For instance, a curved portion of a waveguide can have a ridge that extends away from a slab region with a thickness greater than or equal to 0.0 μm and less than 0.5 μm. While the above dimensions will generally provide the straight or substantially straight portions of a waveguide with a single-mode construction, they can result in the tapered section(s) and/or curved section(s) that are multi-mode. Coupling between the multi-mode geometry to the single mode geometry can be done using tapers that do not substantially excite the higher order modes. Accordingly, the waveguides can be constructed such that the signals carried in the waveguides are carried in a single mode even when carried in waveguide sections having multi-mode dimensions. The waveguide construction of FIG. 2 is suitable for all or a portion of the waveguides selected from the group consisting of the cavity waveguide 12, utility waveguide 16, reference waveguide 27, comparative waveguide 30, first detector waveguide 36, second detector waveguide 38, sampling waveguide 52, control waveguide 57, and interferometer waveguide 60.

The light source 10 that is interfaced with the utility waveguide 16 can be a gain element that is a component separate from the chip and then attached to the chip. For instance, the light source 10 can be a gain element that is attached to the chip using a flip-chip arrangement.

Use of flip-chip arrangements is suitable when the light source 10 is to be interfaced with a ridge waveguide on a chip constructed from silicon-on-insulator wafer. Examples of suitable interfaces between flip-chip gain elements and ridge waveguides on chips constructed from silicon-on-insulator wafer can be found in U.S. Pat. No. 9,705,278, issued on Jul. 11, 2017 and in U.S. Pat. No. 5,991,484 issued on Nov. 23 1999; each of which is incorporated herein in its entirety. The constructions are suitable for use as the light source 10. When the light source 10 is a gain element, the electronics 62 can change the frequency of the outgoing LIDAR signal by changing the level of electrical current applied to through the gain element.

The attenuators can be a component that is separate from the chip and then attached to the chip. For instance, the attenuator can be included on an attenuator chip that is attached to the chip in a flip-chip arrangement. The use of attenuator chips is suitable for all or a portion of the attenuators selected from the group consisting of the data attenuator and the control attenuator.

As an alternative to including an attenuator on a separate component, all or a portion of the attenuators can be integrated with the chip. For instance, examples of attenuators that are interfaced with ridge waveguides on a chip constructed from a silicon-on-insulator wafer can be found in U.S. Pat. No. 5,908,305, issued on Jun. 1 1999; each of which is incorporated herein in its entirety. The use of attenuators that are integrated with the chip are suitable for all or a portion of the light sensors selected from the group consisting of the data attenuator and the control attenuator.

Light sensors that are interfaced with waveguides on a chip can be a component that is separate from the chip and then attached to the chip. For instance, the light sensor can be a photodiode, or an avalanche photodiode. Examples of suitable light sensor components include, but are not limited to, InGaAs PIN photodiodes manufactured by Hamamatsu located in Hamamatsu Ciy, Japan, or an InGaAs APD (Avalanche Photo Diode) manufactured by Hamamatsu located in Hamamatsu City, Japan. These light sensors can be centrally located on the chip as illustrated in FIG. 1. Alternately, all or a portion the waveguides that terminate at a light sensor can terminate at a facet 18 located at an edge of the chip and the light sensor can be attached to the edge of the chip over the facet 18 such that the light sensor receives light that passes through the facet 18. The use of light sensors that are a separate component from the chip is suitable for all or a portion of the light sensors selected from the group consisting of the first light sensor 40, the second light sensor 42, the sampling light sensor 54, and the control light sensor 61.

As an alternative to a light sensor that is a separate component, all or a portion of the light sensors can be integrated with the chip. For instance, examples of light sensors that are interfaced with ridge waveguides on a chip constructed from a silicon-on-insulator wafer can be found in Optics Express Vol. 15, No. 21, 13965-13971 (2007); U.S. Pat. No. 8,093,080, issued on Jan. 10 2012; U.S. Pat. No. 8,242,432, issued Aug. 14 2012; and U.S. Pat. No. 6,108, 8472, issued on Aug. 22, 2000 each of which is incorporated herein in its entirety. The use of light sensors that are integrated with the chip are suitable for all or a portion of the light sensors selected from the group consisting of the first light sensor 40, the second light sensor 42, the sampling light sensor 54, and the control light sensor 61.

Construction of optical gratings that are integrated with a variety of optical device platforms are available. For instance, a Bragg grating can be formed in a ridge waveguides by forming grooves in the top of the ridge and/or in the later sides of the ridge.

In some instances, it is desirable to scan the LIDAR output signal. The above chip construction is suitable for use with various scanning mechanisms used in LIDAR applications. For instance, the output LIDAR signal can be received by one or more reflecting devices and/or one more collimating devices. The one or more reflecting devices can be configured to re-direct and/or steer the LIDAR output signal so as to provide scanning of the LIDAR output signal. Suitable reflecting devices include, but are not limited to, mirrors such mechanically driven mirrors and Micro Electro Mechanical System (MEMS) mirrors. The one or more collimating devices provide collimation of the LIDAR output signal and can accordingly increase the portion of the LIDAR input signal that is received in the utility waveguide 16. Suitable collimating devices include, but are not limited to, individual lenses and compound lenses.

Figure 3:
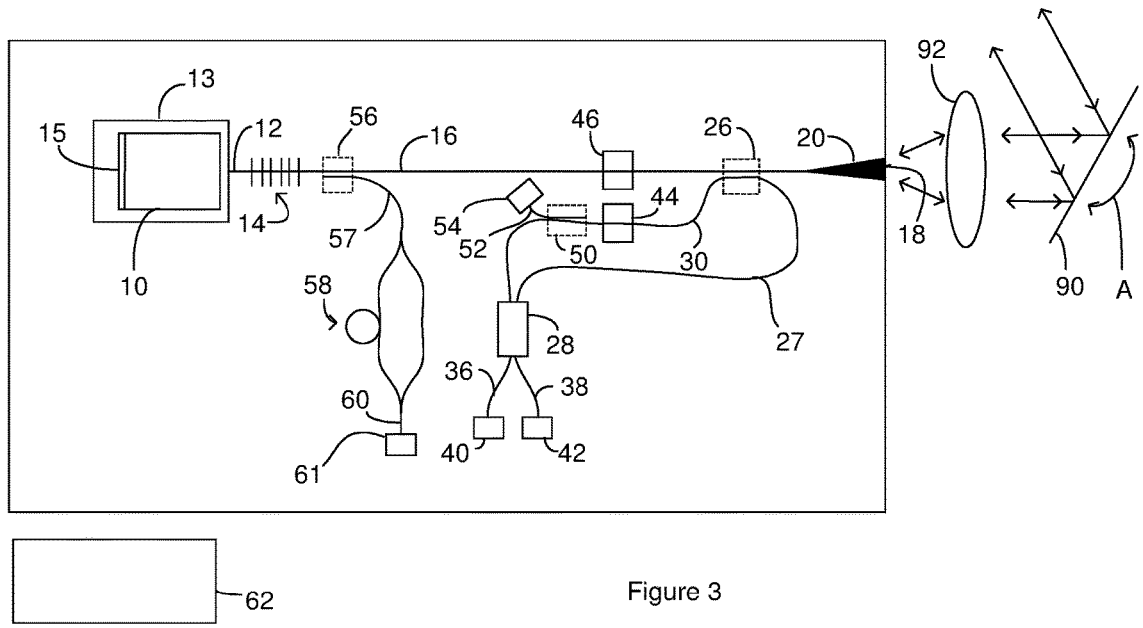
FIG. 3 illustrates the LIDAR chip of FIG. 1 used with an off-chip scanning mechanism.

FIG. 3 illustrates the above chip used with a reflecting device 90 and a collimating device 92. For instance, a lens serves as a collimating device that receives the LIDAR output signal and provides collimation of the LIDAR output signal. A mirror serves as a reflecting device 90 that receives the collimated LIDAR output signal and reflects the collimated LIDAR output signal in the desired direction. As is illustrated by the arrow labeled A, the electronics can move the mirror so as to steer the collimated LIDAR output signal and/or scan the collimated LIDAR output signal. The movement of the mirror can be in two dimensions or three dimensions. Suitable mirrors include, but are not limited to, mechanically driven mirrors and Micro Electro Mechanical System (MEMS) mirrors.

Figure 4:
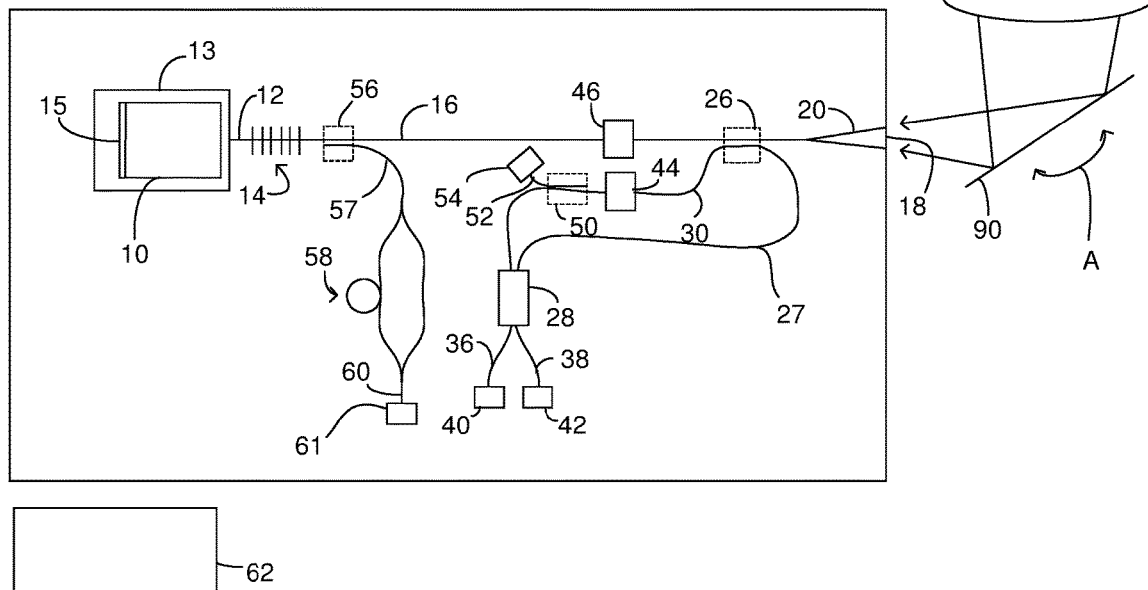
FIG. 4 illustrates the LIDAR chip of FIG. 1 used with another embodiment of an off-chip scanning mechanism.

FIG. 4 illustrates the above chip used with a reflecting device 90 and a collimating device 92. For instance, a mirror serves as a reflecting device 90 that receives the LIDAR output signal and reflects the LIDAR output signal in the desired direction. As is illustrated by the arrow labeled A, the electronics can move the mirror so as to steer the LIDAR output signal and/or scan the LIDAR output signal. A lens serves as a collimating device 92 that receives the LIDAR output signal from the mirror and provides collimation of the LIDAR output signal. The lens can be configured to move with the movement of the mirror so the lens continues to receive the LIDAR output signal at different positions of the mirror. Alternately, the movement of the mirror can be sufficiently limited that the lens continues to receive the LIDAR output signal at different positions of the mirror. The movement of the mirror can be in two dimensions or three dimensions. Suitable mirrors include, but are not limited to, mechanically driven mirrors and Micro Electro Mechanical System (MEMS) mirrors.

Figure 5:
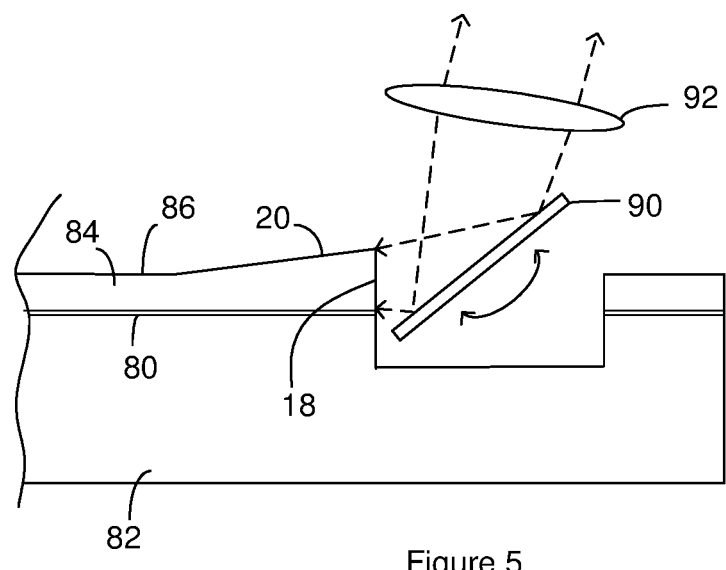
FIG. 5 is a cross section of the LIDAR chip of FIG. 1 having an integrated scanning mechanism.

Technologies such as SOI MEMS (Silicon-On-Insulator Micro Electro Mechancial System) technology can be used to incorporate a reflecting device such as a MEMS mirror into the chip. For instance, FIG. 5 is a cross section of a portion of the chip taken through the longitudinal axis of the utility waveguide 16. The illustrated chip was constructed on silicon-on-insulator waveguide. A mirror recess extends through the light-transmitting medium to the base. The mirror is positioned in the mirror recess such that the mirror receives the LIDAR output signal from the utility waveguide. A lens serves as a collimating device 92 that receives the LIDAR output signal from the mirror and provides collimation of the LIDAR output signal. The lens can be configured to move with the movement of the mirror so the lens continues to receive the LIDAR output signal at different positions of the mirror. Alternately, the movement of the mirror can be sufficiently limited that the lens continues to receive the LIDAR output signal at different positions of the mirror. The electronics can control movement of the mirror in two or three dimensions.

Suitable electronics can include, but are not limited to, a controller that includes or consists of analog electrical circuits, digital electrical circuits, processors, microprocessors, digital signal processors (DSPs), computers, microcomputers, or combinations suitable for performing the operation, monitoring and control functions described above. In some instances, the controller has access to a memory that includes instructions to be executed by the controller during performance of the operation, control and monitoring functions. Although the electronics are illustrated as a single component in a single location, the electronics can include multiple different components that are independent of one another and/or placed in different locations. Additionally, as noted above, all or a portion of the disclosed electronics can be included on the chip including electronics that are integrated with the chip.

Although the laser cavity is shown as being positioned on the chip, all or a portion of the laser cavity can be located off the chip. For instance, the utility waveguide 16 can terminate at a second facet through which the outgoing LIDAR signal can enter the utility waveguide 16 from a laser cavity located off the chip.

The chip can include components in addition to the illustrated components. As one example, optical attenuators (not illustrated) can be positioned along the first detector waveguide 36 and the second detector waveguide 38. The electronics can operate these attenuators so the power of the first portion of the composite sample signal that reaches the first light sensor 40 is the same or about the same as the power of the second portion of the composite sample signal that reaches the second light sensor 42. The electronics can operate the attenuators in response to output from the first light sensor 40 which indicates the power level of the first portion of the composite sample signal and the second light sensor 42 which indicates the power level of the second portion of the composite sample signal.

Other embodiments, combinations and modifications of this invention will occur readily to those of ordinary skill in the art in view of these teachings. Therefore, this invention is to be limited only by the following claims, which include all such embodiments and modifications when viewed in conjunction with the above specification and accompanying drawings.

The invention claimed is:

1. A LIDAR system, comprising:
a LIDAR chip with a ridge waveguide configured to guide an outgoing LIDAR signal and a LIDAR input signal, the LIDAR input signal including light from the LIDAR output signal after an object located outside of the LIDAR system reflects the light from the LIDAR output signal,
the ridge waveguide including a ridge of a light-transmitting medium extending away from slab regions of the light-transmitting medium,
the ridge having a width greater than 1 µm and less than 4 µm,
the ridge having a height greater than 1 µm and less than 4 µm, and
the slab regions having a thickness greater than 0.5 µm and less than 3µm;
the LIDAR chip including a coupler configured to couple a portion of the outgoing LIDAR signal from the ridge waveguide onto a reference waveguide as a reference signal and also to couple a portion of the LIDAR input signal from the ridge waveguide onto a comparative waveguide as a comparative signal;
the LIDAR chip configured to generate a composite signal having light from the reference signal beating with light from the comparative singal; and
electronics configured to use the composite signal to generate LIDAR data that includes the distance between the LIDAR chip and the object.

2. The system of claim 1, wherein the LIDAR chip is a silicon-on-insulator chip.

3. The system of claim 1, wherein the ridge waveguide is a single mode waveguide.

4. The system of claim 1, wherein the ridge waveguide includes one or more sections with multi-mode dimensions.

5. The system of claim 1, wherein the ridge waveguide includes a tapered section.

6. The system of claim 1, wherein the ridge waveguide includes a curved section where the ridge extends away from one or more slab region having a thickness greater than 0.5 µm.

7. The system of claim 1, wherein at least a portion of the electronics are included on the LIDAR chip.

8. The system of claim 1, wherein the LIDAR data includes the relative velocity between the object and the LIDAR chip.

9. The system of claim 1, wherein the system includes a light sensor configured to convert light from the composite signal to an electrical signal that the electronics use to generate the LIDAR data.

10. The system of claim 9, wherein the ridge waveguide carries the outgoing LIDAR signal to a facet through which the outgoing LIDAR signal exits from the LIDAR chip;

the LIDAR chip includes a control branch that taps a portion of the outgoing LIDAR signal from the ridge waveguide,
the control branch includes a control light sensor that receives a light signal that includes light from the tapped a portion of the outgoing LIDAR signal.

11. The system of claim 10 wherein the electronics are configured to tune a frequency of the outgoing LIDAR signal in response to output from the control light sensor.

12. The system of claim 10, wherein the data branch includes a sampling light sensor that receives a light signal that includes light from the comparative light signal.

13. The system of claim 12 wherein the electronics are configured to attenuate an intensity of the comparative light signal in response to an output of the sampling light sensor.

14. The system of claim 12 wherein the electronics are configured to attenuate an intensity of the outgoing LIDAR signal in response to an output of the sampling light sensor.

15. The system of claim 1, wherein the ridge waveguide terminates at a facet through which the outgoing LIDAR signal exits from the LIDAR chip, the ridge waveguide is also configured to receive a LIDAR input light signal through the facet, the LIDAR input light signal including light from the outgoing LIDAR signal; and the LIDAR chip includes a data branch that includes a light sensor that receives a light signal that includes light from the LIDAR input light signal.

16. The system of claim 15 wherein the electronics are configured to attenuate an intensity of the light signal that includes light from the LIDAR input light signal in response to an output of the light sensor.

17. The system of claim 1, wherein the ridge waveguide terminates at a facet through which the outgoing LIDAR signal exits from the LIDAR chip; and an optical attenuator configured to attenuate an intensity of the outgoing LIDAR signal on the utility waveguide.

18. The system of claim 17, wherein a sampling light sensor that receives a light signal that includes light from the outgoing LIDAR signal, and
the electronics are configured to operate the optical attenuator in response to an output of a sampling light sensor.

19. The system of claim 1, wherein the ridge waveguide receives a comparative light signal that includes light from a LIDAR input light signal, the LIDAR input light signal including light reflected by the object located off of the LIDAR chip, and an optical attenuator configured to attenuate an intensity of the comparative light signal on the waveguide; and
the LIDAR chip includes a sampling light sensor that receives a light signal that includes light from the comparative light signal, and
the electronics are configured to operate the optical attenuator in response to an output of the sampling light sensor.

20. The system of claim 1, wherein the comparative light signal does not include light from the reference light signal.

* * * * *